US010601301B2

(12) United States Patent
Terada

(10) Patent No.: US 10,601,301 B2
(45) Date of Patent: Mar. 24, 2020

(54) ABNORMALITY DETECTION DEVICE AND VEHICLE-MOUNTED POWER SUPPLY DEVICE

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventor: Noriko Terada, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

(*) Notice: Subject to any disclaimer, the term of this patent is extended or adjusted under 35 U.S.C. 154(b) by 0 days.

(21) Appl. No.: 16/322,042

(22) PCT Filed: Jul. 12, 2017

(86) PCT No.: PCT/JP2017/025333
§ 371 (c)(1),
(2) Date: Jan. 30, 2019

(87) PCT Pub. No.: WO2018/025598
PCT Pub. Date: Feb. 8, 2018

(65) Prior Publication Data
US 2019/0181741 A1   Jun. 13, 2019

(30) Foreign Application Priority Data

Aug. 2, 2016 (JP) .................................. 2016-151756

(51) Int. Cl.
*H02M 3/158* (2006.01)
*H02M 1/32* (2007.01)
*H02M 1/00* (2006.01)
*H02M 1/36* (2007.01)
(Continued)

(52) U.S. Cl.
CPC ............... *H02M 1/08* (2013.01); *B60R 16/03* (2013.01); *H02M 1/32* (2013.01); *H02M 1/36* (2013.01);
(Continued)

(58) Field of Classification Search
CPC ...... H02M 3/158; H02M 3/1584; H02M 1/32; H02M 2001/0009; H02M 1/36
See application file for complete search history.

(56) References Cited

U.S. PATENT DOCUMENTS

2016/0200355 A1*   7/2016   Mori .................... B62D 5/0484
                                                    180/446
2016/0254749 A1    9/2016   Kawakami
(Continued)

FOREIGN PATENT DOCUMENTS

JP       2013-110837 A    6/2013
JP       2014-204570 A    10/2014

OTHER PUBLICATIONS

International Search Report, Application No. PCT/JP2017/025333, dated Aug. 29, 2017.

*Primary Examiner* — Jeffrey A Gblende
*Assistant Examiner* — Sisay G Tiku
(74) *Attorney, Agent, or Firm* — Honigman LLP

(57) ABSTRACT

An abnormality detection device includes a detection circuit unit, a protection circuit unit, and an abnormality determination unit. The detection circuit unit includes: a voltage detection circuit and a current detection circuit that generate, as analog signals, detection values indicating a current and a voltage at a predetermined position of a vehicle-mounted power supply device. An A/D converter converts the detection value into a digital signal. The protection circuit unit performs a predetermined protection operation on the vehicle-mounted power supply device if a voltage or a current of an input path or an output path of a voltage (Continued)

converting unit has an abnormal value. The abnormality determination unit makes at least one of the detection circuit unit and the protection circuit unit perform a predetermined diagnosis operation, and determines, based on a result of the diagnosis operation, whether the detection circuit unit and the protection circuit unit is abnormal.

13 Claims, 10 Drawing Sheets

(51) Int. Cl.
  *H02M 1/08* (2006.01)
  *B60R 16/03* (2006.01)
  *G01R 31/40* (2020.01)
(52) U.S. Cl.
  CPC ......... *H02M 3/158* (2013.01); *H02M 3/1584* (2013.01); *G01R 31/40* (2013.01); *H02M 2001/325* (2013.01)

(56) References Cited

U.S. PATENT DOCUMENTS

| | | | |
|---|---|---|---|
| 2018/0254695 A1* | 9/2018 | Igarashi | H02M 3/155 |
| 2018/0287500 A1* | 10/2018 | Tsutsui | H02M 3/155 |
| 2018/0294721 A1* | 10/2018 | Abe | H02M 3/155 |
| 2018/0366943 A1* | 12/2018 | Matsuoka | H02H 7/1225 |
| 2019/0058401 A1* | 2/2019 | Kitamoto | H01M 8/04567 |
| 2019/0058411 A1* | 2/2019 | Kitamoto | H02M 5/458 |
| 2019/0109529 A1* | 4/2019 | Nobe | H02M 1/00 |
| 2019/0168634 A1* | 6/2019 | Teng | B60L 58/18 |

* cited by examiner

Legend
A= Power Supply

ABNORMALITY DETECTION DEVICE AND VEHICLE-MOUNTED POWER SUPPLY DEVICE

CROSS-REFERENCE TO RELATED APPLICATIONS

This application is the U.S. national stage of PCT/JP2017/025333 filed Jul. 12, 2017, which claims priority of Japanese Patent Application No. JP 2016-151756 filed Aug. 2, 2016.

TECHNICAL FIELD

The present disclosure relates to an abnormality detection device that detects an abnormality in a vehicle-mounted power supply device and to the vehicle-mounted power supply device.

BACKGROUND

JP 2013-46541A discloses a power supply device that includes a multiphase chopper and a failure detection means. The multiphase chopper includes phase chopper units connected in parallel, drives a switching element for each phase chopper unit at different phases, and converts a direct-current voltage from a power generator into a predetermined output voltage. The failure detection means detects failure of a switching element of a phase chopper unit.

DISCLOSURE

However, the power supply device disclosed in JP 2013-46541A is configured to diagnose a failure when normal voltage conversion is performed, and thus there is the problem of the processing load increasing during the failure diagnosis, which affects normal operation. Moreover, although the power supply device disclosed in JP 2013-46541A has the function of determining failure of the switching element for each phase, it cannot determine whether or not circuits such as a monitor circuit and a protection circuit are operating properly.

The present disclosure was conceived in view of the stated circumstances, and it is an object of the present disclosure to determine whether a component that is of high importance for operating a vehicle-mounted power supply device is abnormal.

SUMMARY

An abnormality detection device serving as an example according to the present disclosure is an abnormality detection device that detects abnormality of a vehicle-mounted power supply device including a voltage converting unit that steps up and down an input voltage by turning a switching element on and off, the abnormality detection device including: a detection circuit unit including a detection unit configured to generate, as an analog signal, a detection value indicating the magnitude of at least one of a current and a voltage at a predetermined position of the vehicle-mounted power supply device, and a converting unit configured to convert the detection value generated by the detection unit into a digital signal; a protection circuit unit configured to perform a predetermined protection operation on the vehicle-mounted power supply device in one of cases where at least one of a voltage and a current of an input path to the voltage converting unit has an abnormal value and where at least one of a voltage and a current of an output path from the voltage converting unit has an abnormal value; and an abnormality determination unit configured to make at least one of the detection circuit unit and the protection circuit unit perform a predetermined diagnosis operation, and determine, based on a result of the diagnosis operation, whether the at least one of the detection circuit unit and the protection circuit unit is abnormal.

Advantageous Effects of Disclosure

The abnormality detection device described above includes the abnormality determination unit, and the abnormality determination unit makes at least one of the detection circuit unit and the protection circuit unit perform the predetermined diagnosis operation, and determines, based on the result of the predetermined diagnosis operation, whether the at least one of the detection circuit unit and the protection circuit unit is abnormal. With this operation performed by the abnormality determination unit, abnormality can be determined by making the at least one of the detection circuit unit and the protection circuit unit actually perform the diagnosis operation, and whether or not a component that is of high importance for achieving normal operation of the vehicle-mounted power supply device is abnormal can be confirmed.

DETAILED DESCRIPTION OF PREFERRED EMBODIMENTS

Figure 1:
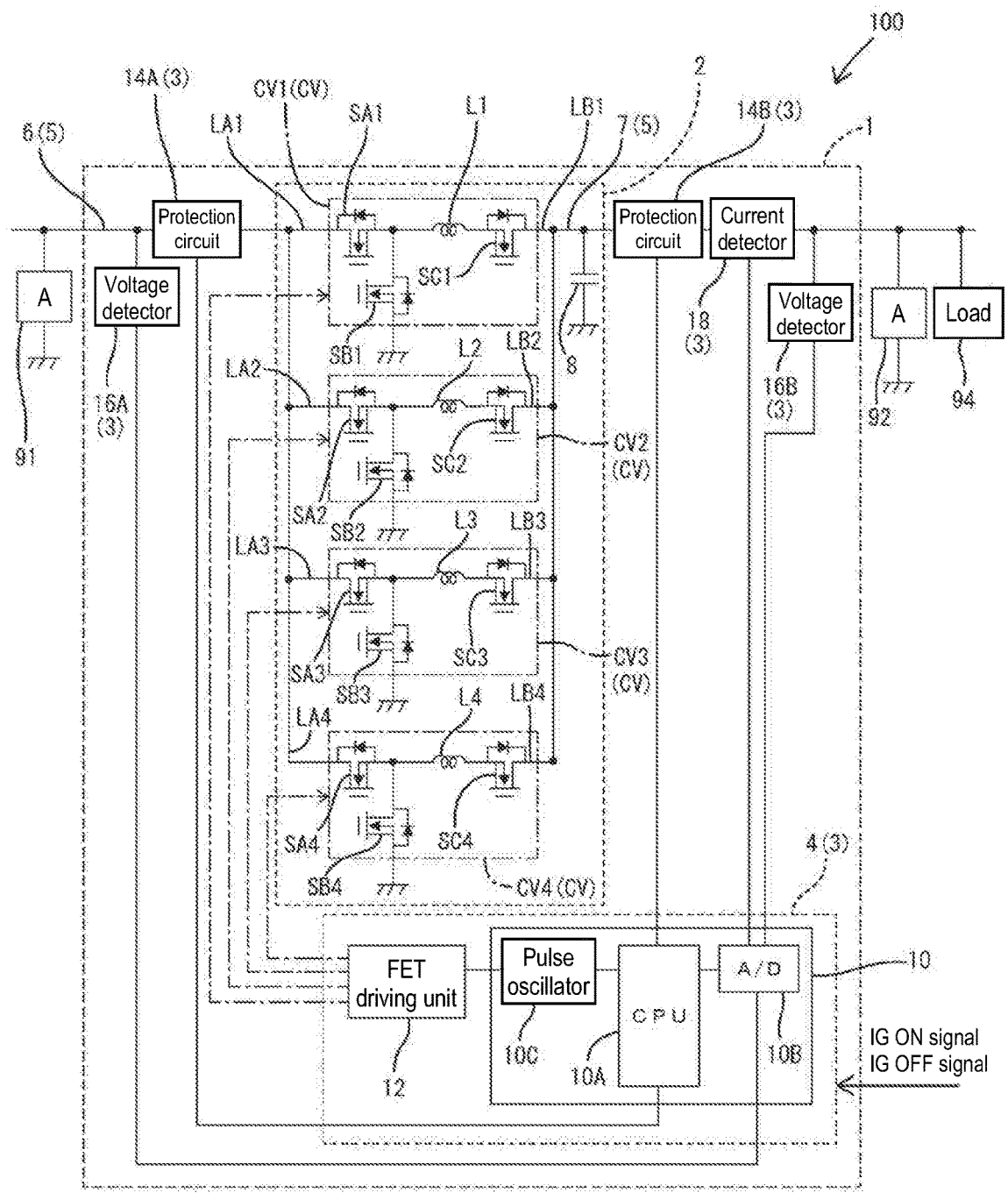
FIG. 1 is a circuit diagram showing an example of a vehicle-mounted power supply system that includes an abnormality detection device and a vehicle-mounted power supply device according to Embodiment 1.

Hereinafter, a preferred example of the present disclosure is described. Note that the present disclosure is not limited to the example described below.

An abnormality determination unit may make at least one of the detection circuit unit and the protection circuit unit perform a diagnosis operation when a predetermined operation stop condition for a vehicle is met, and determine, based on the result of the predetermined diagnosis operation, whether the at least one of the detection circuit unit and the protection circuit unit is abnormal, and may make, it is determined that the at least one of the detection circuit unit and the protection circuit unit is abnormal, a target circuit unit out of the detection circuit unit and the protection circuit unit that is determined as being abnormal perform a predetermined rediagnosis operation when a predetermined operation start condition for a vehicle is met, and redetermine, based on the result of the predetermined rediagnosis operation, whether the target circuit unit is abnormal.

The abnormality detection device having the above configuration can perform the diagnosis operation and the corresponding abnormality determination operation after the predetermined operation stop condition for the vehicle is met. Accordingly, a component that is of high importance can be checked while keeping normal operations performed while the vehicle is traveling from being affected. Moreover, if it is determined through the abnormality determination operation that there is an abnormality, the circuit unit determined as being abnormal (the target circuit unit) is made to perform the rediagnosis operation so that the abnormality can be redetermined. Thus, it can be determined more precisely which one of the circuit units is abnormal. In addition, when the predetermined operation start condition for the vehicle is met, the rediagnosis operation and the abnormality redetermination operation can be executed early before the vehicle advances. In this way, not only the diagnosis operation and the abnormality determination operation but also the rediagnosis operation and the redetermination operation can be performed while keeping normal operations performed while the vehicle is traveling from being affected. Furthermore, after an abnormality is determined, a situation in which the vehicle travels despite redetermination not being performed is unlikely to occur.

The abnormality determination unit may make the converting unit included in the detection circuit unit perform a predetermined self-diagnosis operation, and determine, based on the self-diagnosis operation performed by the converting unit, whether the converting unit included in the detection circuit unit is abnormal.

For the abnormality determination device having the above configuration, the converting unit, which is of high importance for monitoring the current or the voltage, is a diagnosis target, and the abnormality determination device can specifically confirm whether or not the converting unit is abnormal.

The abnormality determination unit may provide the protection circuit unit with one of: a pseudo signal indicating that one of the voltage and the current of the input path has an abnormal value; and a pseudo signal indicating that one of the voltage and the current of the output path has an abnormal value, and determine whether the protection circuit unit is abnormal based on the result of an operation performed by the protection circuit unit in response to the pseudo signal.

For the abnormality determination device having the above configuration, the protection circuit unit, which is of high importance for addressing an abnormal voltage or abnormal current, is a diagnosis target, and the abnormality determination device can specifically confirm whether or not the protection circuit unit is abnormal. Specifically, a pseudo signal corresponding to the actual abnormality is generated, and based on the result of the operation performed by the protection circuit unit in response to this signal, whether the protection circuit unit is abnormal can be determined. Thus, whether or not the protection circuit unit can operate normally can be determined more precisely.

The vehicle-mounted power supply device may include a multiphase converting unit having a plurality of the voltage converting units. The abnormality determination unit may make the plurality of the voltage converting units operate one by one or for each group including at least two of the plurality of the voltage converting units, and detect the one or the group that is abnormal based on an output from the multiphase converting unit while the one or the group is operating.

The abnormality detection device having the above configuration can perform the abnormality determination operation on the detection circuit unit or the protection circuit unit, which are of high importance for achieving normal operation of the vehicle-mounted power supply device. In addition to this, the abnormality detection device can perform the abnormality determination operation on the multiphase converting unit and also specifically identify an abnormal phase.

The vehicle-mounted power supply may include the abnormality detection device and the voltage converting unit described above. This configuration can realize a vehicle-mounted power supply device having the same effect as the abnormality detection device described above.

Embodiment 1

Hereinafter, Embodiment 1 embodying the present disclosure is described.

A vehicle-mounted power supply device 1 (hereinafter, also referred to as the "power supply device 1") shown in FIG. 1 is configured as a vehicle-mounted multiphase DC-DC converter included in a vehicle-mounted power supply system 100 and converts a DC voltage (an input voltage) applied to an input-side conductive path 6 using a multiphase step-down method, and then outputs an output voltage obtained by stepping down the input voltage to an output-side conductive path 7.

The power supply device 1 includes: a power supply line 5 including the input-side conductive path 6 and the output-side conductive path 7; a multiphase converting unit 2 having n number of voltage converting units CV1, CV2, ..., and CVn that convert an input voltage and output the converted voltage; and a control unit 4 that controls the voltage converting units CV1, CV2, ..., and CVn individually using a control signal. It should be noted that the number of voltage converting units (the maximum number of phases in the multiphase converting unit 2) may be any natural number greater than 1. The following describes a typical example presented by the configuration in FIG. 1 in which "n=4". In this configuration, an abnormality detection device 3 includes components of the power supply device 1 excluding the multiphase converting unit 2. The abnormality detection device 3 includes the control unit 4, protection circuits 14A and 14B, voltage detection circuits 16A and 16B, and a current detection circuit 18.

The input-side conductive path 6 is, for example, a primary (high-voltage side) power supply line to which a relatively high voltage is applied, is electrically continuous with a high-potential terminal of a primary power supply unit 91, and the primary power supply unit 91 applies a predetermined DC voltage (48 V, for example) thereto. The input-side conductive path 6 is connected to respective input paths LA1, LA2, LA3, and LA4 of the voltage converting units CV1, CV2, CV3, and CV4. The primary power supply unit 91 includes a power storage means, such as a lithium-ion battery or an electric double layer capacitor, the high-potential terminal thereof is kept at a predetermined high potential (48 V for example), and a low potential terminal thereof is kept at ground potential (0 V) for example. Moreover, the input-side conductive path 6 is also electrically connected to an electrical generator (not shown) configured as an alternator.

The output-side conductive path 7 is configured as a secondary (low-voltage side) power supply line to which a relatively low voltage is applied. The output-side conductive path 7 is connected to a power storage means (such as a lead storage battery) that outputs a DC voltage (12 V for example) smaller than the output voltage from the primary power supply unit 91. Moreover, the output-side conductive path 7 is also connected to a load 94 (see FIG. 2) such as a vehicle-mounted electrical apparatus.

The multiphase converting unit 2 is disposed between the input-side conductive path 6 and the output-side conductive path 7. The multiphase converting unit 2 includes the n number of voltage converting units CV1, CV2, ..., and CVn connected in parallel between the input-side conductive path 6 and the output-side conductive path 7. The n number of voltage converting units CV1, CV2, ..., and CVn have the same configuration and function as step-down converters according to a synchronous rectification method. In the following, each of the respective voltage converting units of the n number of voltage converting units CV1, CV2, ..., and CVn is also individually referred to as a voltage converting unit CV. The respective input paths LA1, LA2, ..., and LAn of the n number of voltage converting units CV1, CV2, ..., and CVn branch off from the input-side conductive path 6. Moreover, respective output paths LB1, LB2, ..., and LBn of the n number of voltage converting units CV1, CV2, ..., and CVn are connected to the output-side conductive path 7, which is the common output path. Here, the n number of voltage converting units CV1, CV2, ..., and CVn refer to the converting units at a first phase, a second phase, ..., and an n-th phase. In the present specification, "the voltage converting unit corresponding to the phase" may also be referred to simply as "the phase".

Out of the n number of voltage converting units CV1, CV2, ..., and CVn, a voltage converting unit CVk at a k-th phase is described. In the following, k is a natural number less than or equal to n. The voltage converting unit CVk at the k-th phase includes a switching element SAk on the high side, a switching element SBk on the low side, an inductor Lk, and a protection switching element SCk. For example, the voltage converting unit CV1 at the first phase includes a switching element SA1 on the high side, a switching element SB1 on the low side, an inductor L1, and a protection switching element SC1. The converting unit CV2 at the second phase includes a switching element SA2 on the high side, a switching element SB2 on the low side, an inductor L2, and a protection switching element SC2. The third phase and the fourth phase each have a configuration similar to the above.

The switching element SAk of the voltage converting unit CVk at the k-th phase is an N-channel MOSFET, and a drain of the switching element SAk is connected to an individual input path LAk branching off from the input-side conductive path 6. A source of the switching element SAk is connected to a drain of the switching element SBk on the low side and to one end of the inductor Lk. The drain of the switching element SBk is connected to a node between the switching element SAk and the inductor Lk, and its source is grounded. The other end of the inductor Lk is connected to a source of the switching element SCk. A drain of the switching element SCk is connected to the output-side conductive path 7. The switching element SCk also functions to interrupt conduction of a path in the event of an abnormality such as overcurrent, overvoltage, or backflow. Here, although control lines connected to respective gates of the switching elements SAk, SBk, and SCk are not illustrated in FIG. 1, the switching elements SAk, SBk, and SCk can be controlled by the control unit 4 via respective control lines.

The control unit 4 mainly includes a control circuit 10 and an FET driving unit 12. The control circuit 10 is, for example, configured as an MCU (Micro Controller Unit) and includes a CPU 10A that performs various arithmetic operations, an A/D converter 10B that converts an analog voltage into a digital signal, and a pulse oscillator 10C. Furthermore, the control unit 10 is also provided with, for example, a storage unit (not shown) configured with a semiconductor storage means such as a ROM and a RAM. Voltage values output from the voltage detection circuits 16A and 16B, the current detection circuit 18, and the like which are described later, are input to the A/D converter 10B.

The control circuit 10 of the control unit 4 has the function of determining a duty and the function of generating and outputting a PWM signal based on the determined duty. Specifically, the control circuit 10 generates the PWM signal for each of the n number of voltage converting units CV1, CV2, ..., and CVn and then outputs the generated PWM signal. For example, when the n number of voltage converting units CV1, CV2, ..., and CVn are all driven in a steady output state, the control circuit 10 generates PWM signals different in phase by $2\pi/n$ and outputs the PWM signals to the n number of voltage converting units CV1, CV2, ..., and CVn. When the multiphase converting unit 2 includes the four voltage converting units CV1, CV2, CV3, and CV4 as in the example shown in FIG. 1, the converting units are provided with the respective PWM signals different in phase by $2\pi/4$ from the control unit 4. According to a known method, the control circuit 10 generates, using a pulse signal generated by the pulse oscillator 10C, a PWM signal based on the duty calculated in the arithmetic processing.

In response to the PWM signals for each of the phases generated by the control circuit 10, the FET driving unit 12 applies ON signals to the gates of the switching elements SAk and SBk to alternately turn on the switching elements SAk and SBk (where k is a natural number between 1 to n inclusive) of the phases. The signal provided to the gate of the switching element SBk while the PWM signals are output to the switching elements SAk and SBk is inverted in phase with respect to the signal provided to the gate of the switching element SAk, with dead time ensured.

The power supply device 1 includes: the voltage detection circuit 16A that detects an input voltage value of the common input path (i.e., the input-side conductive path 6) to the plurality of voltage converting units CV1, CV2, ..., and CVn; the voltage detection circuit 16B that detects an output voltage value of the common output path (i.e., the output-side conductive path 7) from the plurality of voltage converting units CV1, CV2, . . . , and CVn; and the current detection circuit 18 that detects an output current value of the common output path (i.e., the output-side conductive path 7) from the plurality of voltage converting units CV1, CV2, . . . , and CVn.

The voltage detection circuit 16A is configured to output, to the A/D converter 10B of the control circuit 10, a value reflecting the voltage value of the input-side conductive path 6 (such as the voltage value itself of the input-side conductive path 6 or a value of a divided voltage obtained by dividing the voltage value using a voltage dividing circuit). The voltage detection circuit 16B is configured to output, to the A/D converter 10B of the control circuit 10, a value reflecting the voltage value of the output-side conductive path 7 (such as the voltage value itself of the output-side conductive path 7 or a value of a divided voltage obtained by dividing the voltage value using a voltage dividing circuit).

The current detection circuit 18 may be configured to output, as a detection value, the voltage value corresponding to the current passing through the output-side conductive path 7. For example, the current detection circuit 18 includes a resistor and a differential amplifier interposed in the output-side conductive path 7. A voltage between both ends of the resistor is input to the differential amplifier. Then, a voltage drop made by the resistor according to the current passing through the output-side conductive path 7 is amplified by the differential amplifier, and this amplified value is output as the detection value to the A/D converter 10B of the control circuit 10.

In the above configuration, the voltage detection circuits 16A and 16B and the current detection circuit 18 correspond to an example of a detection unit, and function to generate, as an analog signal, a detection value indicating the magnitude of at least one of the current and the voltage at a predetermined position of the power supply device 1. The A/D converter 10B corresponds to an example of a converting unit, and functions to convert the detection value generated by the detection unit into a digital signal. Thus, the voltage detection circuits 16A and 16B and the current detection circuit 18 (the detection unit) and the A/D converter 10B (the converting unit) form the detection circuit unit.

The protection circuits 14A and 14B correspond to an example of a protection circuit unit, and when at least one of the voltage and the current of the input path to a voltage converting unit has an abnormal value or when at least one of the voltage and the current of the output path from the voltage converting unit has an abnormal value, function to perform a predetermined protection operation on the power supply device 1.

Figure 2:
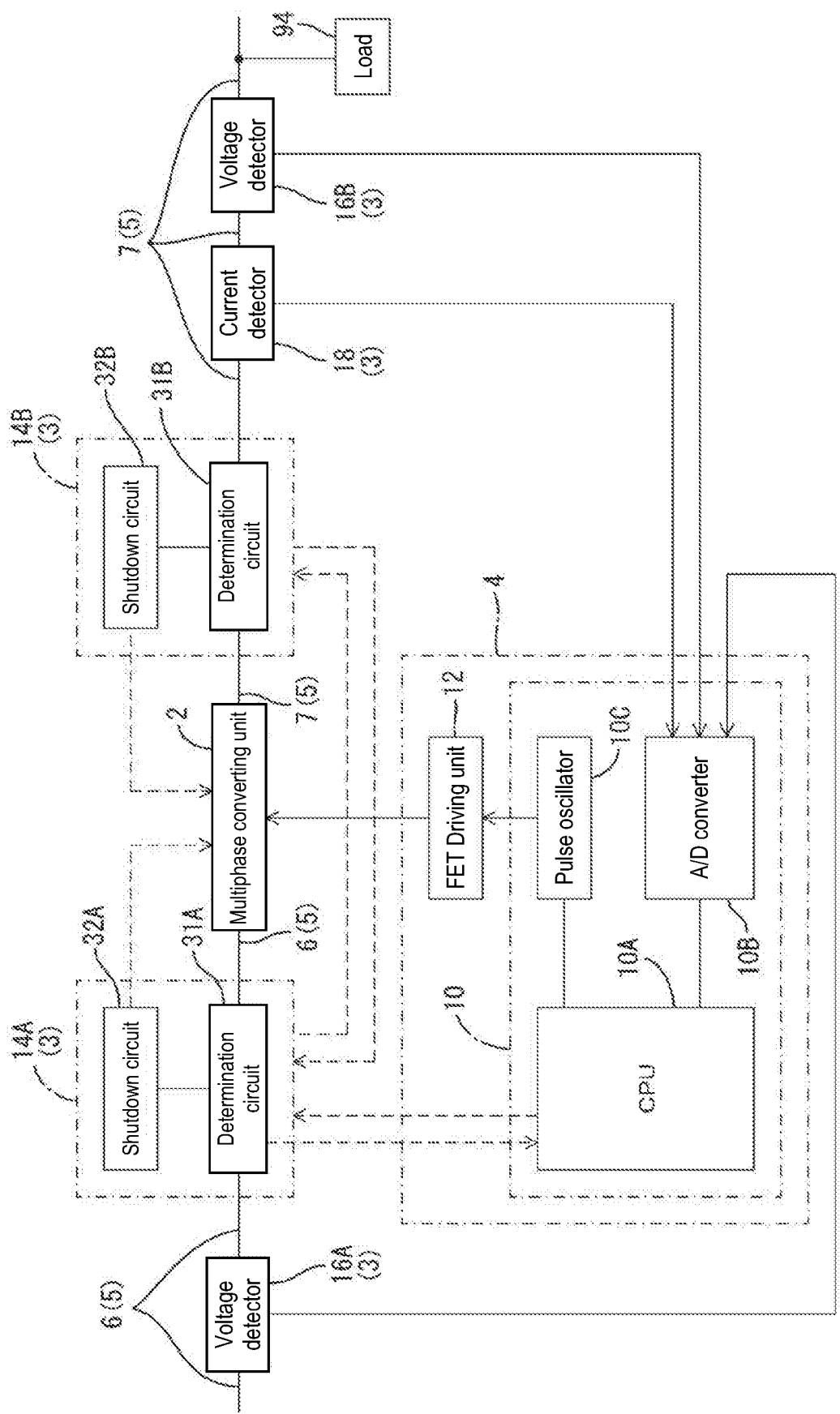
FIG. 2 is a schematic block diagram showing the vehicle-mounted power supply system that includes the abnormality detection device and the vehicle-mounted power supply device according to Embodiment 1.

As shown in FIG. 2, the protection circuit 14A includes a determination circuit 31A that outputs an overcurrent signal to the control unit 4 when the current value of the input-side conductive path 6 is larger than or equal to a predetermined current threshold, and outputs an overvoltage signal to the control unit 4 when the voltage value of the input-side conductive path 6 is larger than or equal to a predetermined voltage threshold. Moreover, the protection circuit 14A includes a shutdown circuit 32A that brings the multiphase converting unit 2 into an operation stop state when the determination circuit 31A outputs an overcurrent signal or an overvoltage signal. When the determination circuit 31A outputs the overcurrent signal or the overvoltage signal to the control unit 4, the shutdown circuit 32A causes the multiphase converting unit 2 to stop operating and maintains this operation stop state until a cancel condition is met. A method by which the shutdown circuit 32A causes the multiphase converting unit 2 to stop operating is not particularly intended to be limiting. For example, when the determination circuit 31A outputs the overcurrent signal or the overvoltage signal to the control unit 4, control may be started in which the control signal input from the FET driving unit 12 to the multiphase converting unit 2 is disabled and this control for disabling is maintained. Then, when the cancel signal (a latch clear signal) is output from the control unit 4, this control for disabling may be cancelled.

As shown in FIG. 2, the protection circuit 14B includes a determination circuit 31B that outputs an overcurrent signal to the control unit 4 when the current value of the output-side conductive path 7 is larger than or equal to a predetermined current threshold, and outputs an overvoltage signal to the control unit 4 when the voltage value of the output-side conductive path 7 is larger than or equal to a predetermined voltage threshold. Moreover, the protection circuit 14B includes a shutdown circuit 32B that brings the multiphase converting unit 2 into an operation stop state when the determination circuit 31B outputs the overcurrent signal or the overvoltage signal. When the determination circuit 31B outputs the overcurrent signal or the overvoltage signal to the control unit 4, the shutdown circuit 32B causes the multiphase converting unit 2 to stop operating and maintains this operation stop state until a cancel condition is met. A method by which the shutdown circuit 32B causes the multiphase converting unit 2 to stop operating is not particularly intended to be limiting. For example, when the determination circuit 31B outputs the overcurrent signal or the overvoltage signal, a control operation may be started in which the control signal input from the FET driving unit 12 to the multiphase converting unit 2 is disabled and this control for disabling is maintained. Then, when a cancel signal (a latch clear signal) is output from the control unit 4, this control for disabling may be cancelled.

Next, driving control performed on the multiphase converting unit 2 by the control unit 4 is described.

A basic operation in a steady state is first described. The basic operation in the steady state is performed, before control operations shown in FIG. 3 to FIG. 7 described later (the control operations performed when a vehicle operation is ended) is performed and after control operations shown in FIG. 8 to FIG. 10 described later (the control operations performed when vehicle operation is started) are performed. The control unit 4 performs control on the multiphase converting unit 2 including the plurality of voltage converting units CVk (where k is a natural number between 1 and n inclusive), and has a function of outputting control signals each switching between an ON signal and an OFF signal to the switching elements SAk and SBk provided for each of the voltage converting units CVk of the multiphase converting unit 2.

In the steady state, the control unit 4 outputs a PWM signal with the set dead time to each of the n number of voltage converting units CV1, CV2, . . . , and CVn in a complementary manner. For example, the control unit 4 outputs, with the set dead time to the gates of the switching elements SAk and SBk of the voltage converting unit CVk at the k-th phase, the OFF signal to the gate of the switching element SBk while outputting the ON signal to the gate of the switching element Sak, and outputs the ON signal to the gate of the switching element SBk while outputting the OFF signal to the gate of the switching element SAk. In response to these complementary PWM signals, the voltage converting unit CVk performs switching between the ON operation and the OFF operation of the switching element SAk in synchronization with switching between the OFF operation and the ON operation of the switching element SBk. As a result, the DC voltage applied to the individual input path Lak is stepped down and the stepped-down voltage is output to the individual output path LBk. The output voltage of the individual output path LBk is determined based on a duty ratio between the PWM signals output to the gates of the switching elements SAk and SBk. This control operation is performed in the same manner when the aforementioned natural number k is any number between 1 and n inclusive, that is, in the same manner for any voltage converting unit at the corresponding phase between the first phase and the n-th phase inclusive.

To operate the multiphase converting unit 2, the control unit 4 controls at least one or all of the voltage converting units CV1, CV2, . . . , and CVn individually using control signals (the PWM signal), and performs feedback control to make the output from the multiphase converting unit 2 reach a set target value. For example, based on the detection value (the current value of the output-side conductive path 7) input from the current detection circuit 18 to the control circuit 10 and the target value of the output current (the target current value), the control unit 4 determines the amount of control (the duty ratio) for each of the phases through feedback calculation according to a known PID control method. Suppose that the number of drive phases in the multiphase converting unit 2 is m. In the steady output state, the control unit 4 outputs, to the m number of voltage converting units, the respective PWM signals different in phase by $2\pi/m$ based on the duty ratio determined by the feedback calculation. Here, when all of the n number of voltage converting units are driven, "n=m". When a p number of voltage converting units out of the n number of voltage converting units are not driven as a result of failure determination described later, "m=n−p".

Next, a control operation performed when vehicle operation is ended is described with reference to FIGS. 3 to 7 and the like.

Figure 3:
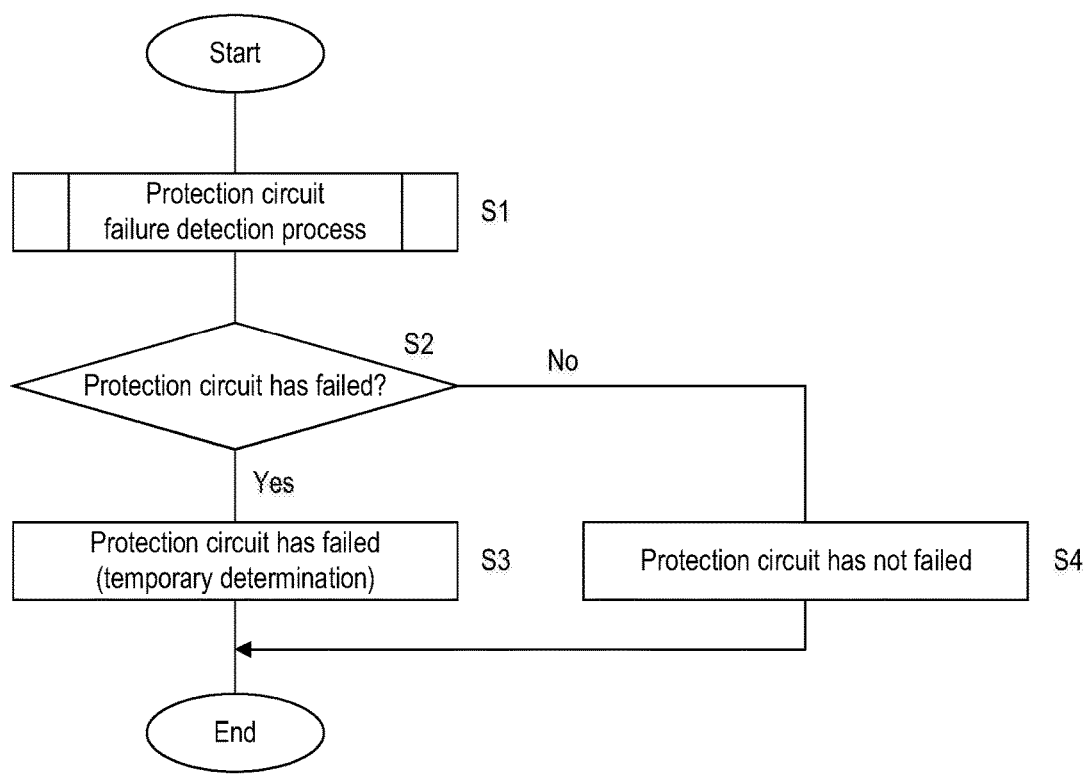
FIG. 3 is an exemplary flowchart of an abnormality detection control operation performed on a protection circuit unit by the abnormality detection device according to Embodiment 1.
Figure 5:
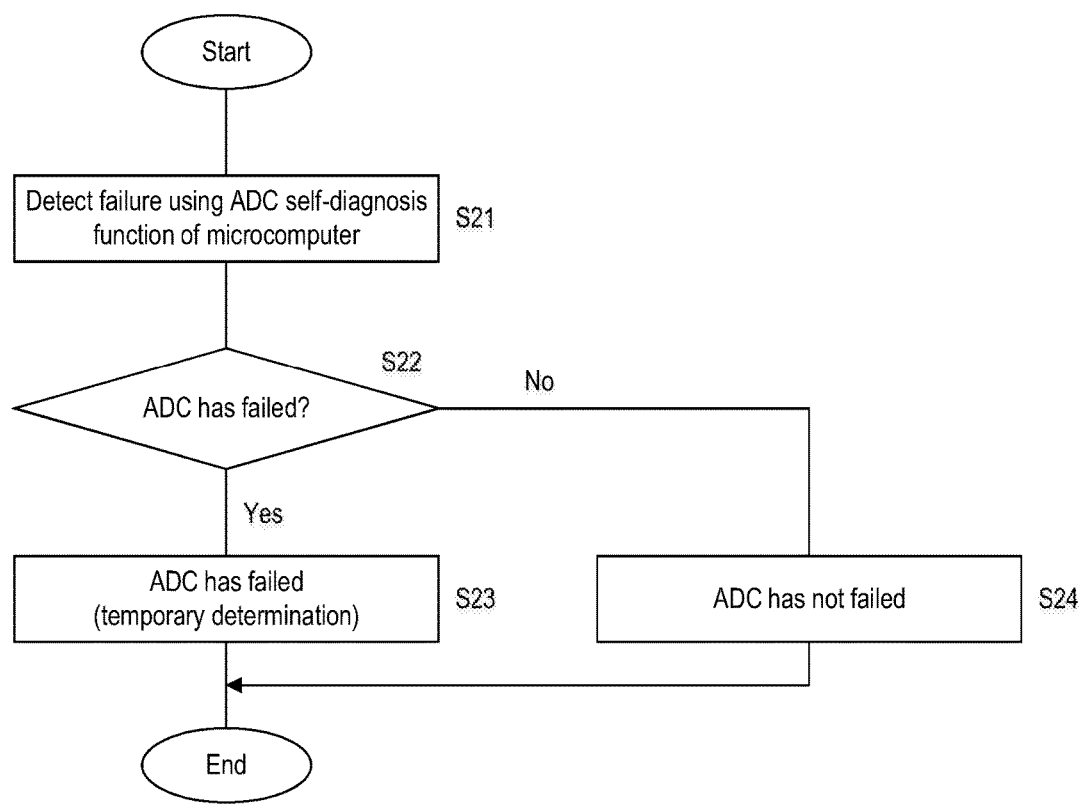
FIG. 5 is an exemplary flowchart of an abnormality detection control operation performed on a detection circuit unit by the abnormality detection device according to Embodiment 1.
Figure 6:
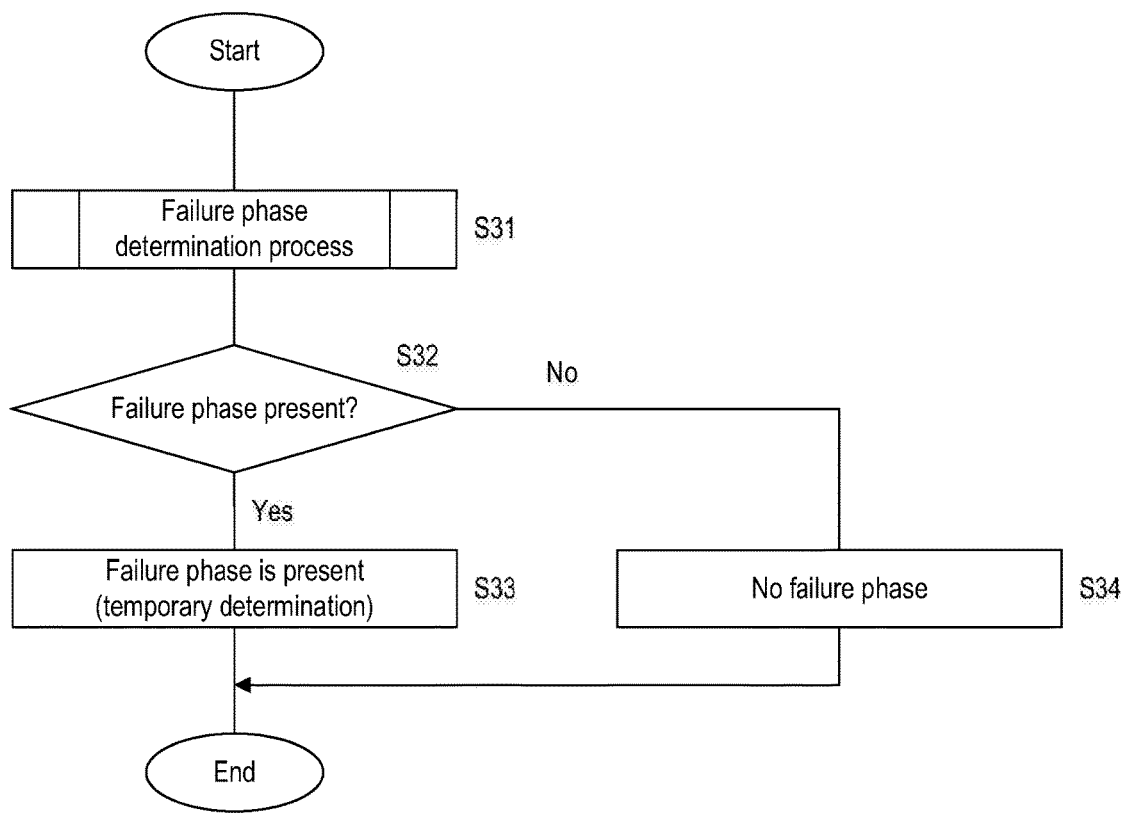
FIG. 6 is an exemplary flowchart of an abnormality detection control operation performed on a multiphase converting unit by the abnormality detection device according to Embodiment 1.

When a predetermined operation stop condition for the vehicle is met, the control circuit 10 of the power supply device 1 shown in FIG. 1 performs the control operations shown in FIG. 3, FIG. 5, and FIG. 6. It should be noted that these control operations may be performed in sequence or in parallel. The following describes, as an example, a case where it is determined that "the predetermined operation stop condition is met" when an ignition switch (not shown) provided in the vehicle including the power supply device 1 is turned off and a signal indicating that the ignition switch is off (an IG off signal) is input to the control circuit 10.

The control operation to determine failure of the protection circuit unit is first described.

The control circuit 10 (or more specifically, the CPU 10A) starts the control operations shown in FIG. 3 in response to the IG off signal being externally input, and first performs a protection circuit failure detection process in step S1. The control unit 10 can perform the protection circuit failure detection process according to the steps shown in FIG. 4. The protection circuit failure detection process can be performed on the protection circuit that is to be a failure detection target. For instance, the processing shown in FIG. 4 can be performed for each of the protection circuits 14A and 14B shown in the examples of FIG. 1 and FIG. 2.

Figure 4:
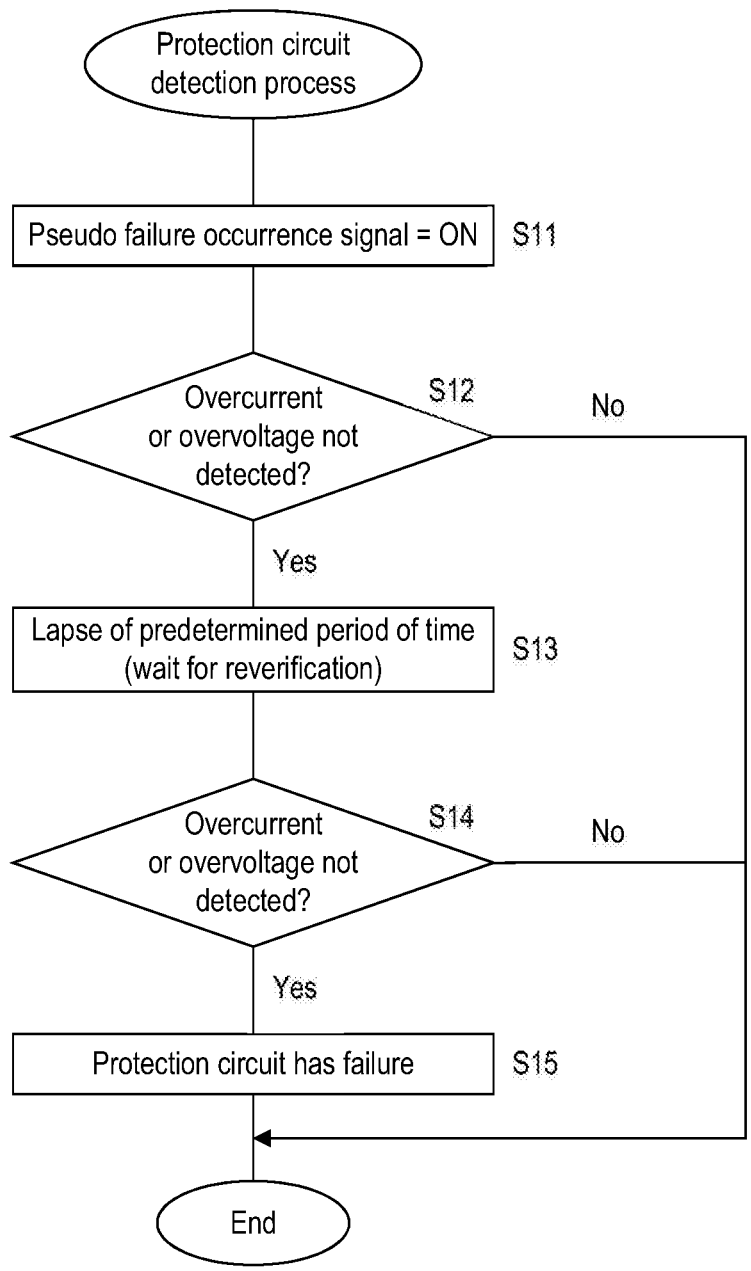
FIG. 4 is an exemplary flowchart of a protection circuit failure detection process included in the abnormality detection control operation shown in FIG. 3.

When performing the protection circuit failure detection process of FIG. 4 on the protection circuit 14A, the control circuit 10 first performs step S11 to set a state in which a pseudo failure occurrence signal is generated (an ON state). When performing the processing of step S11, the control circuit 10 causes a predetermined pseudo overvoltage signal (a voltage signal to be determined by the determination circuit 31A as indicating an overvoltage state (i.e., the signal for a voltage larger than or equal to the predetermined voltage threshold)) to be generated in the input-side conductive path 6 for example, and confirms whether or not the determination circuit 31A outputs an overvoltage signal while the pseudo overvoltage signal is being generated in the input-side conductive path 6 in this way. It should be noted that the method for generating the pseudo overvoltage signal is not particularly intended to be limiting and may be any method by which a voltage exceeding the predetermined voltage threshold (the threshold for determining the overvoltage input during a normal operation) can be applied to the determination circuit 31A of the protection circuit 14A.

Furthermore, when performing the processing of step S11 of FIG. 4, the control circuit 10 causes a predetermined pseudo overcurrent signal (a current signal to be determined by the determination circuit 31A as indicating an overcurrent state (i.e., the signal for a current larger than or equal to the predetermined current threshold)) to be generated in the input-side conductive path 6, and confirms whether or not the determination circuit 31A outputs an overcurrent signal while the pseudo overcurrent signal is being generated in the input-side conductive path 6 in this way. It should be noted that the method for generating the pseudo overcurrent signal is not particularly intended to be limiting and may be any method by which a current exceeding the predetermined current threshold (the threshold for determining the overcurrent input during a normal operation) can be applied to the determination circuit 31A of the protection circuit 14A.

Suppose that the output of the overvoltage signal or the overcurrent signal from the determination circuit 31A is not confirmed while the pseudo overvoltage signal and the pseudo overcurrent signal are being generated as described above. In this case, in step S13 of FIG. 4, the control circuit 10 repeatedly generates the pseudo overvoltage signal and the pseudo overcurrent signal for a predetermined period of time to attempt to detect the overcurrent signal and the overvoltage signal. If neither one of the overvoltage signal and the overcurrent signal is detected during the predetermined period of time in step S13 ("yes" in step S14), the control circuit 10 determines in step S15 failure of protection circuit 14A.

The control circuit 10 can perform the protection circuit failure detection process of FIG. 4 on the protection circuit 14B as well. In this case, in step S11, the control circuit 10 causes a predetermined pseudo overvoltage signal (a voltage signal to be determined by the determination circuit 31B as indicating an overvoltage state (i.e., the signal for a voltage larger than or equal to the predetermined voltage threshold)) to be generated in the output-side conductive path 7 for example, and confirms whether or not the determination circuit 31B outputs the overvoltage signal while the pseudo overvoltage signal is being generated in the output-side conductive path 7 in this way. Furthermore, the control circuit 10 causes a predetermined pseudo overcurrent signal (a current signal to be determined by the determination circuit 31B as indicating an overcurrent state (i.e., the signal of the current larger than or equal to the predetermined current threshold)) to be generated in the output-side conductive path 7, and confirms whether or not the determination circuit 31B outputs the overcurrent signal while the pseudo overcurrent signal is being generated in the output-side conductive path 7 in this way. Suppose that the output of the overvoltage signal or the overcurrent signal from the determination circuit 31B is not confirmed while the pseudo overvoltage signal and the pseudo overcurrent signal are being generated in step S11. In this case, it is determined as "yes" is determined in step S12 and, in step S13, the control circuit 10 repeatedly generates the pseudo overvoltage signal and the pseudo overcurrent signal for the predetermined period of time to attempt to detect the overcurrent signal and the overvoltage signal. If neither one of the overvoltage signal and the overcurrent signal is detected during the predetermined period of time in step S13 ("yes" in step S14), the control circuit 10 determines in step S15 failure of the protection circuit 14B.

After performing the protection circuit failure detection process shown in FIG. 4 on the protection circuits 14A and 14B, the control circuit 10 performs the determination process in step S2 of FIG. 3. In this process, the control circuit 10 determines whether or not at least one of the protection circuits 14A and 14B has been determined as having failed in the protection circuit failure detection process. If it is determined that at least one of the protection circuits 14A and 14B was determined in the protection circuit failure detection process as having failed ("yes" in step S2), the control circuit 10 performs the process in step S3 and stores information indicating that the protection circuit has failed to the storage unit (not shown).

In this way, the control circuit 10 corresponds to an example of the abnormality determination unit, and when the predetermined operation stop condition for the vehicle is met (such as when the IG off signal is input), functions such that the detection circuit unit and the protection circuit unit are made to perform a predetermined diagnosis operation, and based on the result of the diagnosis operation, determine whether the detection circuit unit and the protection circuit unit are abnormal. To be more specific, when the operation stop condition is met, the control circuit 10 (the abnormality determination unit) provides pseudo signals to the protection circuit 14A. The pseudo signals include a pseudo voltage signal causing the voltage of the input path to have an abnormal value and a pseudo current signal causing the current of the input path to have an abnormal value. The control circuit 10 functions to determine whether the protection circuit 14A is abnormal, based on whether or not the protection circuit 14A performs a normal operation, which is to be performed in the event of an abnormality, while the pseudo signals are being generated (or more specifically, based on whether the protection circuit 14A outputs the overvoltage signal and the overcurrent signal). Similarly, when the operation stop condition is met, the control circuit 10 (the abnormality determination unit) provides pseudo signals to the protection circuit 14B. The pseudo signals include a pseudo voltage signal causing the voltage of the output path to have an abnormal value and a pseudo current signal causing the current of the output path to have an abnormal value. The control circuit 10 functions to determine whether the protection circuit 14B is abnormal based on whether or not the protection circuit 14B performs a normal operation, which is to be performed in the event of an abnormality, while the pseudo signals are being generated (or more specifically, based on whether the protection circuit 14B outputs the overvoltage signal and the overcurrent signal).

Next, a control operation performed to determine failure of the detection circuit unit is described.

The control circuit 10 (or more specifically, the CPU 10A) can also perform the control shown in FIG. 5 in response to the IG off signal input from the external source. In the control shown in FIG. 5, the control circuit 10 first performs a failure detection process using a self-diagnosis function in step S21.

The control circuit 10 is equipped with the self-diagnosis function for diagnosing failure of the A/D converter 10B. In step S21 of FIG. 5, the control circuit 10 executes this self-diagnosis function. As the self-diagnosis function, a known self-diagnosis function executed on an A/D converter included in, for example, a known microcomputer may be applied.

For example, the control circuit 10 includes a reference voltage generating circuit (not shown) that generates a predetermined reference voltage. The control circuit 10 inputs, as an analog signal, the reference voltage generated by this internal reference voltage generating circuit to the A/D converter 10B. Then, if data obtained by converting this reference voltage into a digital signal by the A/D converter 10B is within a predetermined normal range, it is determined that the A/D converter 10B is functioning normally. If this data is within an abnormal range instead of within the normal range, failure of the A/D converter 10B is determined.

If the self-diagnosis function determines failure of the A/D converter 10B when executing the self-diagnosis function in step S21 in this way, the control circuit 10 stores information indicating failure of the A/D converter 10B in the storage unit (not shown) in step S23. On the other hand, if failure of the A/D converter 10B is not determined in step S22, the control circuit 10 stores information indicating that the A/D converter 10B has not failed in the storage unit (not shown) in step S24. Note that the information may not be stored in step S24.

When the operation stop condition is met (such as when the IG off signal is input), the control circuit 10 functioning as the abnormality determination unit as described above causes the A/D converter 10B (the converting unit) to perform the predetermined self-diagnosis operation, and based on the self-diagnosis operation performed by the A/D converter 10B, determines whether the A/D converter 10B (the converting unit) is abnormal.

Next, a control operation performed to determine whether the voltage converting unit has failed is described.

The control circuit 10 can also perform the control shown in FIG. 6 in response to the IG off signal input from the external source. In this control in FIG. 6, a failure phase determination process is performed in step S31.

Figure 7:
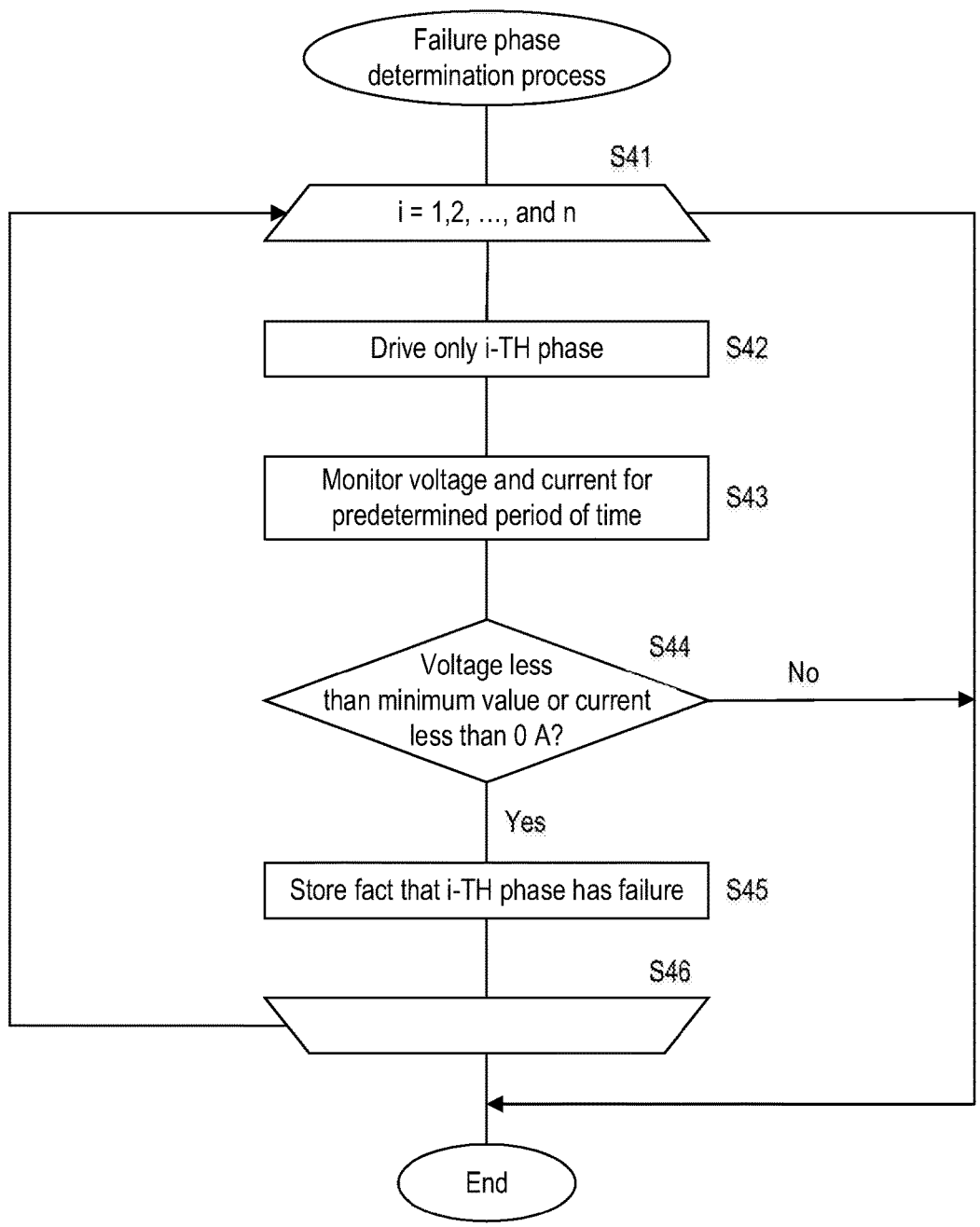
FIG. 7 is an exemplary flowchart of a failure phase determination process included in the abnormality detection control operation shown in FIG. 6.

The control circuit 10 performs the failure phase determination process of step S31 according to the steps shown in FIG. 7. In this failure phase determination process, the processes from step S42 to step S45 are repeated n times for the n phases. Here, "i" represents a value indicating the number of times the processes from step S42 to step S45 are repeated. If "i=1", the processes from step S42 to step S45 are performed for the first phase. If "i=n", the processes from step S42 to step S45 are performed for the n-th phase. Note that immediately after the failure phase determination process in FIG. 7 is started, "i=1", and the value of "i" is counted up each time the processes from step S42 to step S45 are completed. When the value of "i" exceeds n, the failure phase determination process in FIG. 7 is ended.

When performing the process of step S42, the control circuit 10 drives only the i-th phase on the basis of the value of "i" at the start of step S42 and stops driving of the other phases. For example, if "i=1", the control circuit 10 drives only the voltage converting unit CV at the first phase (the first one) and stops driving the other voltage converting units CV. In this way, the control circuit 10 performs the process in step S43 while driving only the voltage converting unit CV of the i-th phase and monitors the output voltage value and the output current value for a predetermined period of time. After step S43, the control circuit 10 performs a determination process in step S44. Suppose that the output voltage value monitored in step S43 is less than a predetermined minimum value (or more specifically, if the voltage value specified by the detection value of the voltage detection circuit 16B is less than a predetermined minimum voltage value), or that the output current value monitored in step S43 is equivalent to 0 A (or more specifically, if the current value specified by the detection value of the current detection circuit 18 is less than a predetermined minimum current value). In this case, the control circuit 10 stores, in the storage unit (not shown), information indicating failure of the voltage converting unit CV at the focused on i-th phase, in step S45. If it is determined in the process of step S44 that the output voltage value monitored in step S43 is larger than or equal to the predetermined minimum value and that the output current value monitored in step S43 is not equivalent to 0 A, the control circuit returns to step S41 from step S46 and then counts up the value of "i".

After ending the failure phase determination process of FIG. 7, the control circuit 10 performs a determination process in step S32 of FIG. 6, and, in the failure phase determination process, determines whether or not the information indicating failure at any phase is stored in the failure phase determination process. Suppose that it is determined that no phase has failed and thus no failure information on any phase is stored in the storage unit (not shown) in the failure phase determination process of FIG. 7. In this case, the control circuit 10 determines in step S34 that no phase has failed and then ends the control shown in FIG. 6 without performing any special process.

On the other hand, suppose that it is determined that a phase has failed and thus the failure information on this phase is stored in the storage unit (not shown) in the failure phase determination process of FIG. 7. In this case, the control circuit 10 determines that there is a failed phase and stores the information indicating that there is a failure phase together with the information identifying the failed phase in the storage unit (not shown) in step S33.

In this way, when the operation stop condition is met (such as when the IG off signal is input), the control circuit 10 functioning as the abnormality determination unit drives the voltage converting units CV one by one in sequence and detects the voltage converting unit CV with an abnormality based on the output from the multiphase converting unit 2 when the driven voltage converting unit CV is operating.

Figure 8:
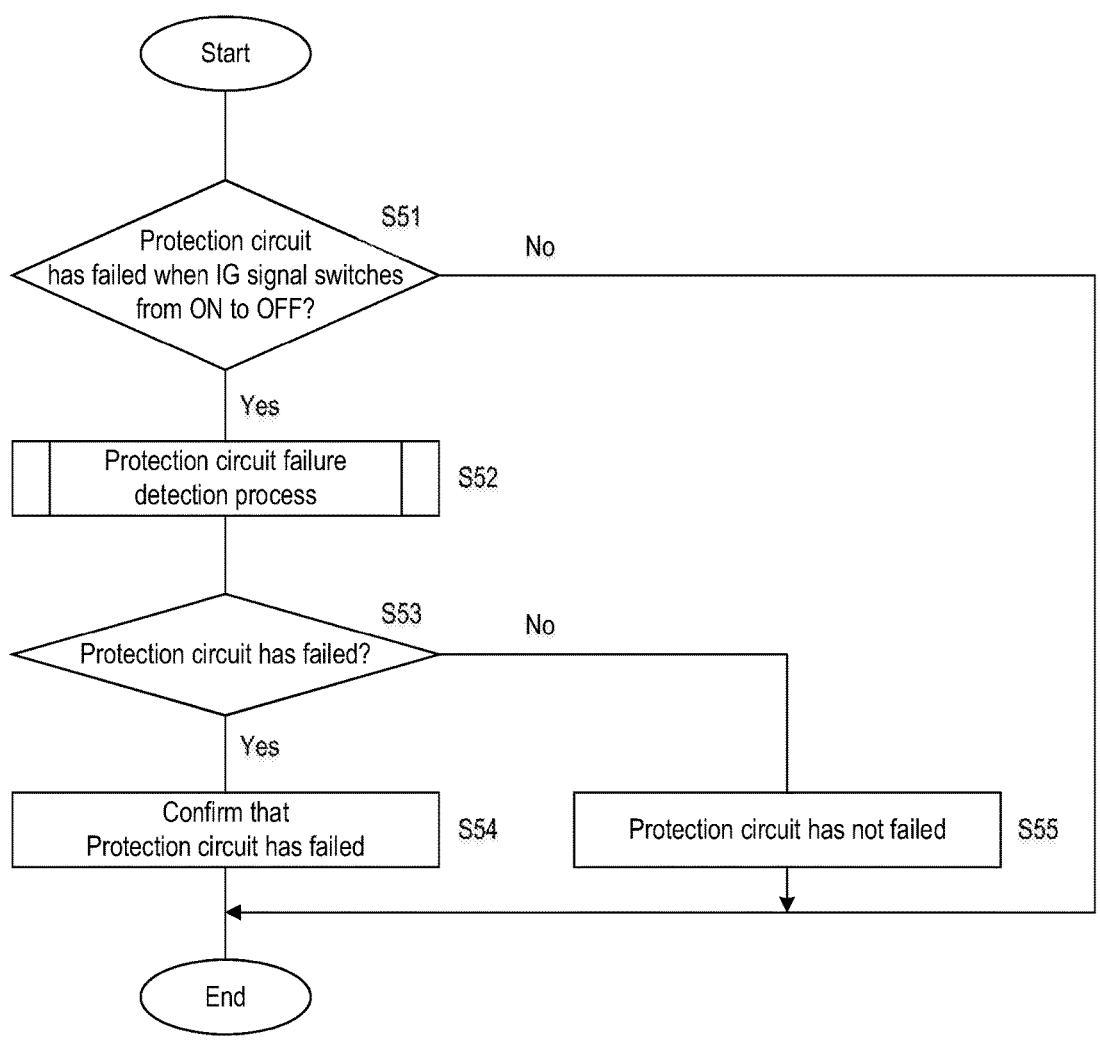
FIG. 8 is an exemplary flowchart of a redetermination control operation performed on the protection circuit unit by the abnormality detection device according to Embodiment 1.
Figure 9:
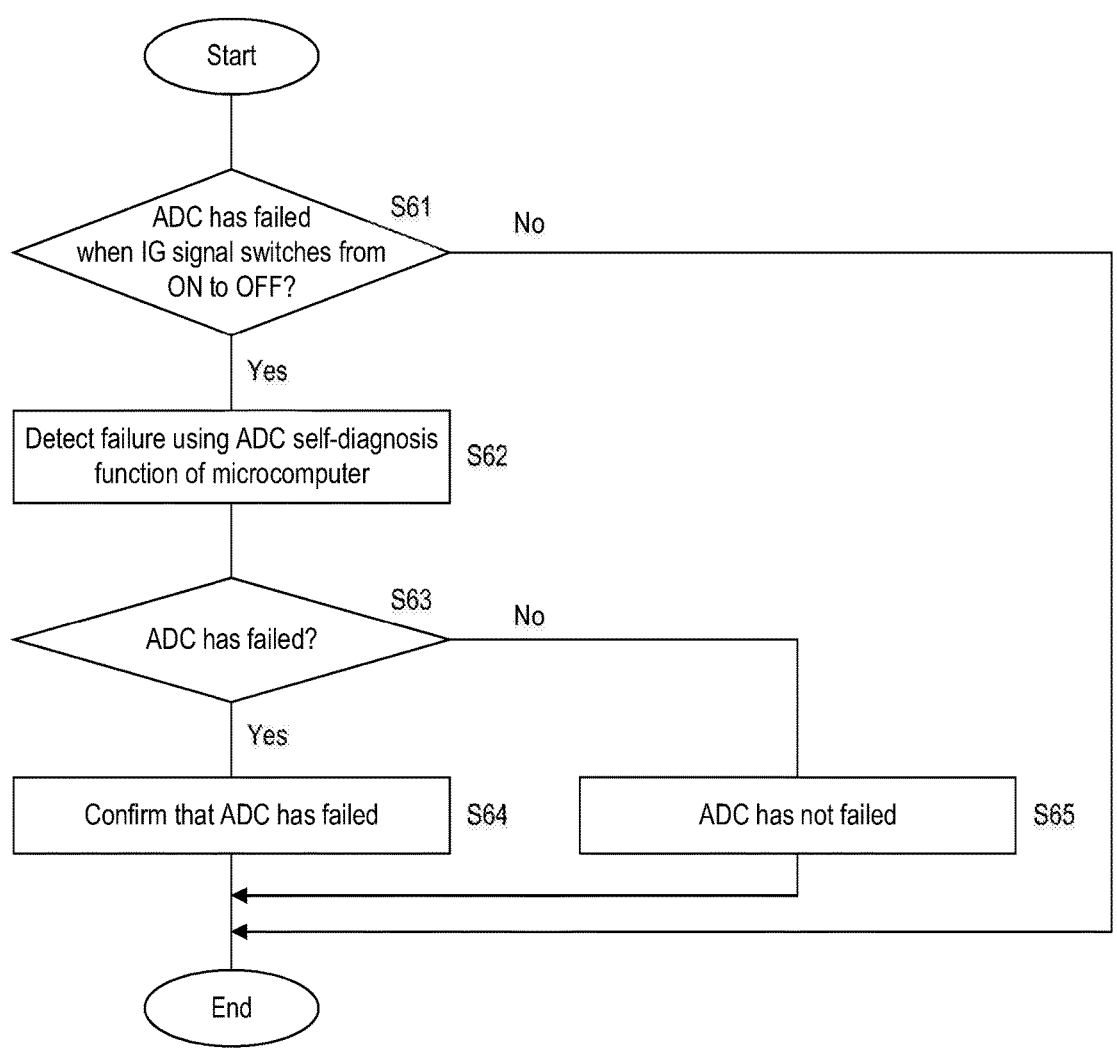
FIG. 9 is an exemplary flowchart of a redetermination control operation performed on the detection circuit unit by the abnormality detection device according to Embodiment 1.
Figure 10:
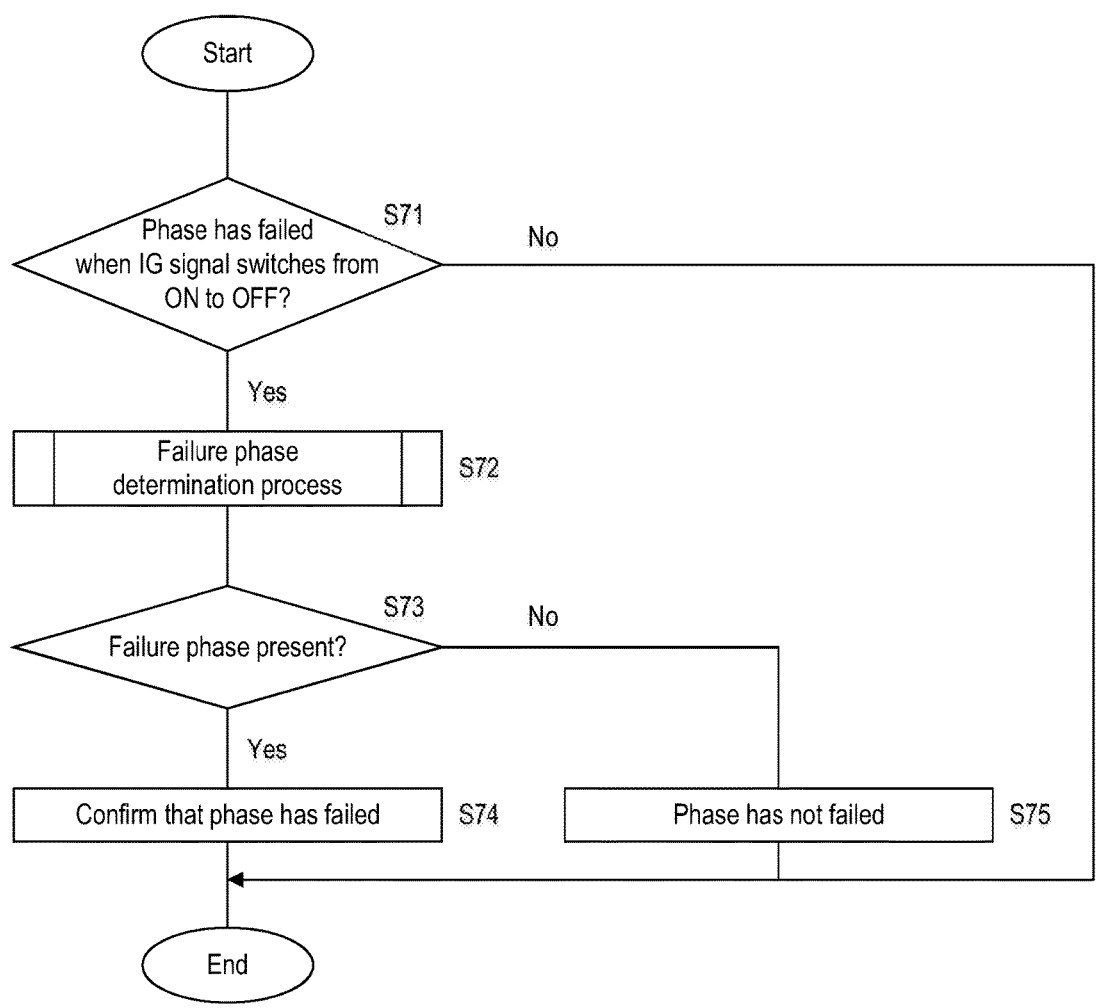
FIG. 10 is an exemplary flowchart of a redetermination control operation performed on the multiphase converting unit by the abnormality detection device according to Embodiment 1.

Next, a control operation performed when the vehicle operation is started is described, with reference to FIG. 8 to FIG. 10.

When a predetermined operation start condition for the vehicle is met (such as when an IG on signal is input), the control circuit 10 performs control operations shown in FIG. 8 to FIG. 10. It should be noted that these control operations in FIG. 8 to FIG. 10 may be performed in sequence or in parallel.

First, redetermination of the failure of the protection circuit is described with reference to FIG. 8.

The control circuit 10 (or more specifically, the CPU 10A) starts the control operation shown in FIG. 8 in response to the IG on signal input from the external source, and first, in step S51, determines whether or not the protection circuit 14A or 14B was determined as having failed in the control operation of FIG. 3 that is performed when the operation stop condition is met (that is, when the IG signal switches from the IG on signal to the IG off signal). If either one of the protection circuits 14A and 14B is not determined as having failed in the control operation of FIG. 3, that is, if neither of the protection circuits 14A and 14B has failed, the control circuit 10 ends the control operation of FIG. 8.

If the protection circuit 14A or 14B is determined as having failed in the control operation of FIG. 3, that is, if the information indicating that the protection circuit 14A or 14B has failed is stored in the storage unit (not shown), the control circuit 10 performs step S52. In this step, the control circuit 10 once again performs the protection circuit failure detection process similar to the process of FIG. 4 on the target protection circuit specified as having failed as per the information stored in the storage unit.

After step S52, the control circuit 10 performs the determination process in step S53. The control circuit 10 performs the protection circuit failure detection process of FIG. 4 on the target protection circuit (the protection circuit having the failure information stored in the storage unit) in step S52. If it is determined again in step S15 that this target protection circuit has failed ("yes" in step S53), the control circuit 10 confirms in step S54 that the target protection circuit (on which the redetermination operation is performed) has failed. When failure of the target protection circuit is confirmed in step S54, a protection operation may be performed to notify an external device (such as a host ECU) of the information indicating that this protection circuit is abnormal or to notify a user with a predetermined notification. Alternatively, a protection operation may be performed to prohibit the multiphase converting unit 2 from operating.

Suppose that the control circuit 10 performs the protection circuit failure detection process of FIG. 4 on the target protection circuit in step S52 without performing step S15 and that the target protection circuit is determined as not having failed ("no" in step S53). The control circuit 10 determines in step S55 that the target protection circuit (on which the redetermination operation is performed) is determined as not having failed. In this case, the information stored in the storage unit earlier in the control operation of FIG. 3 (the information indicating that the target protection circuit has failed) may be deleted.

Next, redetermination of the failure of the A/D converter 10B is described with reference to FIG. 9.

The control circuit 10 (or more specifically, the CPU 10A) starts the control operation shown in FIG. 9 in response to the IG on signal input from the external source, and first, in step S61, determines whether or not the A/D converter 10B was determined as having failed in the control operation of FIG. 5 that is performed when the operation stop condition is met (that is, when the IG signal switches from the IG on signal to the IG off signal). Suppose that the A/D converter 10B was determined as having failed in the control operation of FIG. 5, that is, that information indicating the failure of the A/D converter 10B is stored in the storage unit (not shown). In this case, the control circuit 10 performs the process of step S62 in which the failure detection process is performed again by causing the A/D converter 10B to execute the self-diagnosis function as in step S21 of FIG. 5.

If it is determined again that the A/D converter 10B has failed when executing the self-diagnosis function in step S62 ("yes" in step S63), the control circuit 10 confirms in step S64 that the A/D converter 10B has failed. When failure of the A/D converter 10B is confirmed in this way, a protection operation may be performed to notify an external device (such as the host ECU) of the information indicating that the A/D converter 10B is abnormal or to notify the user using a the predetermined notification. Alternatively, the protection operation may be performed to prohibit the multiphase converting unit 2 from operating.

If it is determined that the A/D converter 10B has not failed when executing the self-diagnosis function in step S62 ("no" in step S63), the control circuit 10 determines in step S65 that the A/D converter 10B has not failed. In this case, the information stored in the storage unit earlier in the control operation of FIG. 5 (the information indicating that the A/D converter 10B has failed) may be deleted.

Next, redetermination of the failure of the voltage converting unit CV is described with reference to FIG. 10.

The control circuit 10 (or more specifically, the CPU 10A) starts the control operation shown in FIG. 10 in response to the IG on signal input from the external source, and first, in step S71, determines whether or not any of the voltage converting units CV was determined as having failed in the control operation of FIG. 6 that is performed when the operation stop condition is met (that is, when the IG signal switches from the IG on signal to the IG off signal). Suppose that one of the voltage converting units CV was determined as having failed in the control operation of FIG. 6, that is, that the information indicating the failure of this voltage converting unit CV is stored in the storage unit (not shown). In this case, the control circuit 10 performs step S72 in which the failure phase determination process as in FIG. 7 is performed again on the voltage converting unit CV determined as having failed (that is, the voltage converting unit having information indicating failure stored in the storage unit).

Specifically, the control circuit 10 performs the same processes as the processes from step S42 to step S45 of FIG. 7 on the voltage converting unit CV determined as having failed in the control operation of FIG. 6 performed earlier (hereinafter, this voltage converting unit is also referred to as the "assumed failure phase"). Specifically, the same process as that of step S42 is first performed to drive only the voltage converting unit CV determined as having failed (the assumed failure phase) and to stop driving the other voltage converting units CV. In this way, the control circuit 10 performs the same process as step S43 while driving only the voltage converting unit CV determined as having failed (the assumed failure phase), and monitors the output voltage value and the output current value for a predetermined period of time. After this monitoring, the control circuit 10 performs the same determination process as step S44. Suppose that the output voltage value monitored during the operation of the assumed failure phase is less than the predetermined minimum value (specifically, if the voltage value specified by the detection value of the voltage detection circuit 16B is less than the predetermined minimum voltage value), or that the output current value monitored during the operation of the assumed failure phase is equivalent to 0 A (specifically, if the current value specified by the detection value of the current detection circuit 18 is less than the predetermined minimum current value). In this case, the control circuit 10 performs the same process as step S45 to again determine that this assumed failure phase has failed. On the other hand, if it is determined that the output voltage value monitored during the operation of the presume failure phase is larger than or equal to the predetermined minimum value and that the output current value monitored during the operation of the presume failure phase is not equivalent to 0 A, the control circuit 10 determines this assumed failure phase as not having failed.

After performing the failure phase determination process in this way, the control circuit 10 determines in step S73 whether the assumed failure phase is determined again as having failed, and, if the assumed failure phase is again determined as having failed, the control circuit 10 confirms in step S74 that the assumed failure phase has failed. When failure of any of the voltage converting units CV is confirmed in this way, the subsequent control operation in the steady state can be performed so that the voltage converting unit CV confirmed as having failed is prohibited from operating and that the voltage conversion is performed by the other voltage converting units CV. Moreover, a protection operation may be performed to notify the external device (such as the host ECU) of the information indicating that one of the voltage converting units CV is abnormal or to notify the user by using a predetermined notification.

If it is determined that the assumed failure phase has not failed ("no" in step S73), the control circuit 10 determines in step S75 that the multiphase converting unit 2 has not failed. In this case, the information stored in the storage unit earlier in the control operation of FIG. 6 (the information indicating that one of the voltage converting units CV has failed) may be deleted.

According to the steps described above, the control circuit 10 performs the control operations shown in FIG. 8 to FIG. 10. Once the control operations shown in FIG. 8 to FIG. 10 have ended, the control circuit 10 shifts to the control operation performed in the steady state as described above.

As described above, the abnormality detection device 3 having the present configuration includes the control circuit 10 functioning as the abnormality determination unit. This control circuit 10 (the abnormality determination unit) causes the detection circuit unit and the protection circuit unit to perform the predetermined diagnosis operation and, based on the result of the diagnosis operation, determines whether the detection circuit unit and the protection circuit unit are abnormal. With this operation performed by the control circuit 10 (the abnormality determination unit), whether the detection circuit unit and the protection circuit unit are abnormal can be determined by causing these circuit units to actually perform the diagnosis operation, and thus whether a component that is of high importance for achieving normal operation of the power supply device 1 is abnormal can be confirmed.

The control circuit 10 (the abnormality determination unit) may make at least one of the detection circuit unit and the protection circuit unit perform the diagnosis operation when the predetermined operation stop condition for the vehicle is met, and determine, based on the result of the diagnosis operation whether the at least one of the detection circuit unit and the protection circuit unit is abnormal. If it is determined that at least one of the detection circuit unit and the protection circuit unit is abnormal, the control circuit 10 (the abnormality determination unit) may make a target circuit unit out of the detection circuit unit and the protection circuit unit that was determined as being abnormal perform a predetermined rediagnosis operation when the predetermined operation start condition is met, and redetermine, based on a result of the predetermined rediagnosis operation, whether the target circuit unit is abnormal.

An abnormality detection device having the above configuration can perform the diagnosis operation and the corresponding abnormality determination operation after the predetermined operation stop condition for the vehicle is met. With this, whether a component that is of high importance is abnormal can be confirmed while keeping normal operations performed while the vehicle is traveling from being affected. Moreover, if it is determined in the abnormality determination operation that there is an abnormality, the circuit unit determined as being abnormal (the target circuit unit) performs a rediagnosis operation so that the abnormality is redetermined. Thus, it can be determined more precisely which one of the circuit units is abnormal. In addition, the rediagnosis operation and the abnormality redetermination operation can be executed early before the vehicle advances, when the predetermined operation start condition for the vehicle is met. In this way, not only the diagnosis operation and the abnormality determination operation but also the rediagnosis operation and the redetermination operation can be performed while keeping normal operations performed while the vehicle is traveling from being affected. Furthermore, after the presence of an abnormality is determined, the vehicle is kept from moving until after redetermination is performed.

The control circuit 10 (the abnormality determination unit) can make the A/D converter 10B (the converting unit) included in the detection circuit unit perform the predetermined self-diagnosis operation, and determine, based on the self-diagnosis operation performed by the A/D converter 10B, whether the A/D converter 10B included in the detection circuit unit is abnormal. For the abnormality detection device 3 having the above configuration, the A/D converter 10B (the converting unit), which is of high importance for monitoring the current or the voltage, is a diagnosis target, and it can specifically confirm whether or not the A/D converter 10B (the converting unit) is abnormal.

The control circuit 10 (the abnormality determination unit) can provide the protection circuits 14A and 14B (the protection circuit unit) with a pseudo signal indicating that the voltage or the current of the input path has an abnormal value or a pseudo signal indicating that the voltage or the current of the output path has an abnormal value, and can determine whether the protection circuits 14A and 14B are abnormal based on a result of an operation performed by the protection circuits 14A and 14B in response to the pseudo signal. For the abnormality detection device 3 having the above configuration, the protection circuits 14A and 14B (the protection circuit unit), which are of high importance for addressing the abnormal voltage or the abnormal current, are a diagnosis target, and it can specifically confirm whether or not the protection circuits 14A and 14B are abnormal. Specifically, a pseudo signal corresponding to the actual abnormality is generated. Then, based on the result of an operation performed by the protection circuits 14A and 14B in response to this signal, whether the protection circuits 14A and 14B are abnormal can be determined, and thus it can be determined more precisely whether or not the protection circuits 14A and 14B can operate normally.

The power supply device 1 includes a multiphase converting unit 2 that has a plurality of voltage converting units CV. The control circuit 10 (the abnormality determination unit) causes the plurality of voltage converting units to operate one by one, and detect the voltage converting unit that is abnormal based on an output from the multiphase converting unit 2 while this voltage converting unit is operating. The abnormality detection device 3 having the above configuration can not only perform the abnormality determination operation on the detection circuit unit or the protection circuit unit, which are of high importance for achieving the normal operation of the power supply device 1, but can also perform the abnormality determination operation on the multiphase converting unit 2 and also specifically identify the abnormal phase.

Other Embodiments

The present disclosure is not limited to the embodiment according to the above description presented with reference to the drawings. For example, the following embodiments are also included in the technical scope according to the present disclosure. Moreover, the embodiments described above and below may be freely combined.

In Embodiment 1, the multiphase step-down converter is described as an example. However, a multiphase step-up converter or a multiphase step up-down converter may be used. Alternatively, a single-phase step-down converter, a single-phase step-up converter, or a single-phase step up-down converter may be used.

In the Embodiment 1, k is a natural number between 1 and n inclusive, and the switching element SBk is imposed on the low side for each phase. However, the switching element SBk may be replaced with a diode having an anode connected to the ground potential. Moreover, each of the switching elements SAk and SBk may be a P-channel MOSFET, or a different type of switching element such as a bipolar transistor.

The primary power supply unit 91 and the secondary power supply unit 92 according to Embodiment 1 are merely examples. Various known power storage means may be applied.

The connection configurations on the input side and the output side according to Embodiment 1 are merely examples. In each of the examples, various devices and electronic components may be electrically connected to the input-side conductive path 6 and to the output-side conductive path 7.

5. Embodiment 1 describes, as a typical example, the power supply device 1 having a four-phase configuration in which the four voltage converting units CV1, CV2, CV3, and CV4 are connected in parallel as shown in FIG. 1. However, the number of voltage converting units may be more than 1 but less than 4, or 5 or more.

Based on the voltage value (the detected voltage value) of the output-side conductive path 7 input to the control circuit 10 and on the target value of the output voltage (the target voltage value), the control unit 4 may perform feedback calculation according to the known PID control method to make the output voltage close to the target voltage value. In addition to this, the control unit 4 may determine the amounts of control (the duty ratio) for the voltage converting units CV.

In Embodiment 1, the protection circuit 14A is configured to perform the protection operation to make the multiphase converting unit 2 stop operating in either of the cases where overcurrent occurs in the input-side conductive path 6 and where overvoltage occurs in the input-side conductive path 6. However, the protection operation may be performed only in the event of overcurrent. Alternatively, the protection operation may be performed only in the event of overvoltage.

In Embodiment 1, the protection circuit 14B is configured to perform the protection operation to make the multiphase converting unit 2 stop operating in either of the cases where overcurrent occurs in the output-side conductive path 7 and where overvoltage occurs in the output-side conductive path 7. However, the protection operation may be performed only in the event of overcurrent. Alternatively, the protection operation may be performed only in the event of overvoltage.

In Embodiment 1, the voltage converting units CV included in the multiphase converting unit 2 are individually driven one by one so that the abnormality determination operation is performed individually, in the process shown in FIG. 7. However, in the process shown in FIG. 7, the operation may be performed for each group including at least two among the voltage converting units CV included in the multiphase converting unit 2 (for example, a group of two voltage converting units). Suppose that the voltage converting units CV are driven for each group. In this case, if the output voltage or the output current is in the abnormal range while a certain group is operating, it may be determined that this group is abnormal. This abnormality determination operation for each group including at least two converting units (at least two phases) may be performed in the abnormality diagnosis after the IG is turned off or may be performed in the rediagnosis after the IG is turned on.

In Embodiment 1, the input of the IG off signal into the control unit 4 is described as an example of the predetermined operation stop condition. However, any condition that can identify the end of vehicle usage can be applied. For example, the predetermined operation stop condition may be that the usage of in-vehicle communication, such as CAN communication, has stopped.

In Embodiment 1, the input of the IG on signal to the control unit 4 is described as an example of the predetermined operation start condition. However, any condition that can identify the start of vehicle usage can be applied. For example, the predetermined operation stop condition may be that the usage of in-vehicle communication, such as CAN communication, has stopped.

Embodiment 1 describes an example in which the control operations shown in FIG. 3 to FIG. 5 are performed when the vehicle operation stops. However, any of the control operations may be omitted.

Embodiment 1 describes an example in which the A/D converter 10B included in the detection circuit unit executes the self-diagnosis function and, based on the result of this function, whether the detection circuit unit has failed is determined, but this example is not intended to be limiting. For example, as the diagnosis operation or the rediagnosis operation, a reference voltage generated by a predetermined reference voltage generating circuit may be input to the input-side conductive path 6 or the output-side conductive path 7. Then, when the value indicated by the data converted by the A/D converter 10B at this time is within a predetermined normal range, the detection circuit unit may be determined as being normal. Otherwise, the detection circuit unit may be determined as having failed.

Embodiment 1 describes an example of the protection circuit, but the protection circuit is not limited to the example described above. For example, each of the input-side conductive path 6 and the output-side conductive path 7 may include a protection switch (such as a semiconductor switching element or a mechanical relay) for switching the corresponding conductive path between an energized state and a non-energized state, and the protection circuit may turn off these switches in the event of overcurrent or overvoltage. In this case, the diagnosis operation and the rediagnosis operation may be performed by turning on or off the protecting switches. For example a method may be employed in which, when the IG off signal is input, the control circuit 10 may perform a diagnosis operation by which the protecting switch of the input-side conductive path 6 is turned off, and if the protecting switch is turned off (for example, when no current passes through the input-side conductive path 6), it may be determined that no failure has occurred, but if the protecting switch is not turned off, it may be determined that failure has occurred. If it is determined that a failure has occurred, whether the switch is abnormal may be determined by performing the rediagnosis operation in the same way as when the IG on signal is input. The diagnosis operation and the rediagnosis operation described above can be performed while the multiphase converting unit 2 is being driven. Similarly, when the IG off signal is input, the control circuit 10 may perform the diagnosis operation by which the protecting switch of the output-side conductive path 7 is turned off, and if the protecting switch is turned off (for example, when no current passes through the output-side conductive path 7), it may be determined that no failure has occurred, and if the protecting switch is not turned off, it may be determined that a failure has occurred. If it is determined that a failure has occurred, whether the switch is abnormal may be determined by performing the rediagnosis operation in same way as when the IG on signal is input.

The invention claimed is:

1. An abnormality detection device that detects abnormality of a vehicle-mounted power supply device including a voltage converting unit that steps up and down an input voltage by turning a switching element on and off, the abnormality detection device comprising:

a detection circuit unit including a detection unit configured to generate, as an analog signal, a detection value indicating the magnitude of at least one of a current and a voltage at a predetermined position of the vehicle-mounted power supply device, and a converting unit configured to convert the detection value generated by the detection unit into a digital signal;

a protection circuit unit configured to perform a predetermined protection operation on the vehicle-mounted power supply device in one of cases where at least one of a voltage and a current of an input path to the voltage converting unit has an abnormal value and where at least one of a voltage and a current of an output path from the voltage converting unit has an abnormal value; and an abnormality determination unit configured to make at least one of the detection circuit unit and the protection circuit unit perform a predetermined diagnosis operation, and determine, based on a result of the predetermined diagnosis operation, whether the at least one of the detection circuit unit and the protection circuit unit is abnormal, wherein the abnormality determination unit is configured to: make the at least one of the detection circuit unit and the protection circuit unit perform the predetermined diagnosis operation when a predetermined operation stop condition for a vehicle is met, and determine, based on the result of the predetermined diagnosis operation, whether the at least one of the detection circuit unit and the protection circuit unit is abnormal; and make, if it is determined that the at least one of the detection circuit unit and the protection circuit unit is abnormal, a target circuit unit out of the detection circuit unit and the protection circuit unit that is determined as being abnormal perform a predetermined rediagnosis operation when a predetermined operation start condition for the vehicle is met, and redetermine, based on the result of the predetermined rediagnosis operation, whether the target circuit unit is abnormal.

2. The abnormality detection device according to claim 1, wherein the abnormality determination unit is configured to make the converting unit included in the detection circuit unit perform a predetermined self-diagnosis operation, and determine, based on the self-diagnosis operation performed by the converting unit, whether the converting unit included in the detection circuit unit is abnormal.

3. The abnormality detection device according to claim 2, wherein the abnormality determination unit is configured to provide the protection circuit unit with one of: a pseudo signal indicating that the at least one of the voltage and the current of the input path has an abnormal value; and a pseudo signal indicating that the at least one of the voltage and the current of the output path has an abnormal value, and determine whether the protection circuit unit is abnormal based on the result of an operation performed by the protection circuit unit in response to the pseudo signal.

4. The abnormality detection device according to claim 2, wherein the vehicle-mounted power supply device includes a multiphase converting unit having a plurality of the voltage converting units, and
the abnormality determination unit is configured to make the plurality of the voltage converting units operate one by one or for each group including at least two of the plurality of the voltage converting units, and detect the one or the group that is abnormal based on an output from the multiphase converting unit while the one or the group is operating.

5. The abnormality detection device according to claim 1, wherein the vehicle-mounted power supply device includes a multiphase converting unit having a plurality of the voltage converting units, and
the abnormality determination unit is configured to make the plurality of the voltage converting units operate one by one or for each group including at least two of the plurality of the voltage converting units, and detect the one or the group that is abnormal based on an output from the multiphase converting unit while the one or the group is operating.

6. The abnormality detection device according to claim 1, wherein the abnormality determination unit is configured to provide the protection circuit unit with one of: a pseudo signal indicating that the at least one of the voltage and the current of the input path has an abnormal value; and a pseudo signal indicating that the at least one of the voltage and the current of the output path has an abnormal value, and determine whether the protection circuit unit is abnormal based on the result of an operation performed by the protection circuit unit in response to the pseudo signal.

7. The abnormality detection device according to claim 1, wherein the vehicle-mounted power supply device includes a multiphase converting unit having a plurality of the voltage converting units, and
the abnormality determination unit is configured to make the plurality of the voltage converting units operate one by one or for each group including at least two of the plurality of the voltage converting units, and detect the one or the group that is abnormal based on an output from the multiphase converting unit while the one or the group is operating.

8. An abnormality detection device that detects abnormality of a vehicle-mounted power supply device including a voltage converting unit that steps up and down an input voltage by turning a switching element on and off, the abnormality detection device comprising:
a detection circuit unit including a detection unit configured to generate, as an analog signal, a detection value indicating the magnitude of at least one of a current and a voltage at a predetermined position of the vehicle-mounted power supply device, and a converting unit configured to convert the detection value generated by the detection unit into a digital signal;
a protection circuit unit configured to perform a predetermined protection operation on the vehicle-mounted power supply device in one of cases where at least one of a voltage and a current of an input path to the voltage converting unit has an abnormal value and where at least one of a voltage and a current of an output path from the voltage converting unit has an abnormal value; and
an abnormality determination unit configured to make at least one of the detection circuit unit and the protection circuit unit perform a predetermined diagnosis operation, and determine, based on a result of the predetermined diagnosis operation, whether the at least one of the detection circuit unit and the protection circuit unit is abnormal, wherein the abnormality determination unit is configured to provide the protection circuit unit with one of: a pseudo signal indicating that the at least one of the voltage and the current of the input path has an abnormal value; and a pseudo signal indicating that the at least one of the voltage and the current of the output path has an abnormal value, and determine whether the protection circuit unit is abnormal based on the result of an operation performed by the protection circuit unit in response to the pseudo signal.

9. The abnormality detection device according to claim 8, wherein the vehicle-mounted power supply device includes a multiphase converting unit having a plurality of the voltage converting units, and
the abnormality determination unit is configured to make the plurality of the voltage converting units operate one by one or for each group including at least two of the plurality of the voltage converting units, and detect the one or the group that is abnormal based on an output from the multiphase converting unit while the one or the group is operating.

10. A vehicle-mounted power supply device, comprising: an abnormality detection device that detects abnormality of the vehicle-mounted power supply device; a voltage converting unit that steps up and down an input voltage by turning a switching element on and off, wherein the abnormality detection device comprises: a detection circuit unit including a detection unit configured to generate, as an analog signal, a detection value indicating the magnitude of at least one of a current and a voltage at a predetermined position of the vehicle-mounted power supply device, and a converting unit configured to convert the detection value generated by the detection unit into a digital signal; a protection circuit unit configured to perform a predetermined protection operation on the vehicle-mounted power supply device in one of cases where at least one of a voltage and a current of an input path to the voltage converting unit has an abnormal value and where at least one of a voltage and a current of an output path from the voltage converting unit has an abnormal value; and an abnormality determination unit configured to make at least one of the detection circuit unit and the protection circuit unit perform a predetermined diagnosis operation, and determine, based on a result of the diagnosis operation, whether the at least one of the detection circuit unit and the protection circuit unit is abnormal, wherein the abnormality determination unit is configured to: make the at least one of the detection circuit unit and the protection circuit unit perform the predetermined diagnosis operation when a predetermined operation stop condition for a vehicle is met, and determine, based on the result of the and the protection circuit unit is abnormal; and make, if it is determined that the at least one of the detection circuit unit and the protection circuit unit is abnormal, a target circuit unit out of the detection circuit unit and the protection circuit unit that is determined as operation start condition for the vehicle is met, and redetermine, based on the result of the predetermined rediagnosis operation, whether the target circuit unit is abnormal.

11. The vehicle-mounted power supply device as set forth in claim 10, wherein the abnormality determination unit is configured to make the converting unit included in the detection circuit unit perform a predetermined self-diagnosis operation, and determine, based on the self-diagnosis operation performed by the converting unit, whether the converting unit included in the detection circuit unit is abnormal.

12. The vehicle-mounted power supply device as set forth in claim 10, wherein the abnormality determination unit is configured to provide the protection circuit unit with one of: a pseudo signal indicating that one of the voltage and the current of the input path has an abnormal value; and a pseudo signal indicating that one of the voltage and the current of the output path has an abnormal value, and determine whether the protection circuit unit is abnormal based on the result of an operation performed by the protection circuit unit in response to the pseudo signal.

13. The vehicle-mounted power supply device as set forth in claim 10, wherein the vehicle-mounted power supply device includes a multiphase converting unit having a plurality of the voltage converting units, and the abnormality determination unit is configured to make the plurality of the voltage converting units operate one by one or for each group including at least two of the plurality of the voltage converting units, and detect the one or the group that is abnormal based on an output from the multiphase converting unit while the one or the group is operating.

* * * * *